(12) United States Patent
Lu et al.

(10) Patent No.: US 7,550,381 B2
(45) Date of Patent: Jun. 23, 2009

(54) CONTACT CLEAN BY REMOTE PLASMA AND REPAIR OF SILICIDE SURFACE

(75) Inventors: Xinliang Lu, Fremont, CA (US); Chien-Teh Kao, Sunnyvale, CA (US); Chiukin Steve Lai, Sunnyvale, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 338 days.

(21) Appl. No.: 11/183,999

(22) Filed: Jul. 18, 2005

(65) Prior Publication Data

US 2007/0015360 A1  Jan. 18, 2007

(51) Int. Cl.
*H01L 21/44* (2006.01)

(52) U.S. Cl. .................. 438/655; 438/4; 438/742; 257/E21.582; 257/E21.483

(58) Field of Classification Search ......... 438/664, 438/658, 4, 906, 722, 738, 742, 654, 682, 438/655; 257/E21.582, E21.483
See application file for complete search history.

(56) References Cited

U.S. PATENT DOCUMENTS

| | | | |
|---|---|---|---|
| 4,951,601 A | | 8/1990 | Maydan et al. |
| 5,000,113 A | | 3/1991 | Wang et al. |
| 5,030,319 A | | 7/1991 | Nishino et al. |
| 5,186,718 A | | 2/1993 | Tepman et al. |
| 5,205,857 A | * | 4/1993 | Yokoyama .............. 75/401 |
| 5,328,558 A | | 7/1994 | Kawamura |
| 5,500,249 A | | 3/1996 | Telford et al. |
| 5,804,499 A | * | 9/1998 | Dehm et al. .............. 438/592 |
| 5,851,926 A | | 12/1998 | Kumar et al. |
| 5,855,681 A | | 1/1999 | Maydan et al. |
| 5,856,240 A | | 1/1999 | Sinha et al. |
| 5,951,776 A | | 9/1999 | Selyutin et al. |
| 5,970,379 A | * | 10/1999 | Chen et al. ............... 428/682 |
| 6,017,809 A | * | 1/2000 | Inumiya et al. .......... 438/585 |
| 6,022,586 A | * | 2/2000 | Hashimoto et al. ...... 427/237 |
| 6,028,002 A | * | 2/2000 | Thakur .................... 438/647 |
| 6,086,677 A | | 7/2000 | Umotoy et al. |
| 6,238,737 B1 | * | 5/2001 | Chan et al. ............ 427/255.18 |
| 6,313,033 B1 | | 11/2001 | Chiang et al. |
| 6,350,320 B1 | | 2/2002 | Sherstinsky et al. |
| 6,364,954 B2 | | 4/2002 | Umotoy et al. |
| 6,524,952 B1 | | 2/2003 | Srinivas et al. |
| 6,562,708 B1 | * | 5/2003 | Hillman et al. .......... 438/592 |

(Continued)

OTHER PUBLICATIONS

Ogawa, et al. "Dry Cleaning Technology for Removal of Silicon Native Oxide Employing Hot NH$_3$/NF$_3$ Exposure," Jpn. J. Appl. Phys. vol. 41 (2002) pp. 5349-5358, Part 1, No. 8, Aug. 2002.

(Continued)

*Primary Examiner*—Caridad M Everhart
(74) *Attorney, Agent, or Firm*—Patterson & Sheridan, LLP (57) ABSTRACT

Method for recovering treated metal silicide surfaces or layers are provided. In at least one embodiment, a substrate having an at least partially oxidized metal silicide surface disposed thereon is cleaned to remove the oxidized regions to provide an altered metal silicide surface. The altered metal silicide surface is then exposed to one or more silicon-containing compounds at conditions sufficient to recover the metal silicide surface.

14 Claims, 7 Drawing Sheets

U.S. PATENT DOCUMENTS

| | | | |
|---|---|---|---|
| 6,700,548 | B1 | 3/2004 | Chen et al. |
| 6,759,286 | B2 | 7/2004 | Kumar et al. |
| 6,833,161 | B2 | 12/2004 | Wang et al. |
| 6,855,643 | B2 | 2/2005 | Nallan et al. |
| 6,858,547 | B2 | 2/2005 | Metzner et al. |
| 6,859,838 | B1 | 2/2005 | Puranik et al. |
| 6,924,191 | B2 | 8/2005 | Liu et al. |
| 2001/0019737 | A1* | 9/2001 | Chan et al. ............. 427/255.27 |
| 2003/0072639 | A1 | 4/2003 | White et al. |
| 2003/0079686 | A1 | 5/2003 | Chen et al. |
| 2003/0194510 | A1 | 10/2003 | Nguyen et al. |
| 2004/0038487 | A1 | 2/2004 | Olsen |
| 2004/0242021 | A1 | 12/2004 | Kraus et al. |
| 2004/0255854 | A1* | 12/2004 | Sakai et al. ................. 118/715 |
| 2005/0009358 | A1 | 1/2005 | Choi et al. |
| 2005/0176191 | A1 | 8/2005 | Kumar et al. |
| 2005/0186765 | A1 | 8/2005 | Ma et al. |

OTHER PUBLICATIONS

Sze, VLSI Technology, McGraw-Hill Book Company, 3 pages.

"The Doping of Semiconductors," http://hyperphysics.phy-astr.gsu.edu/hbase/solids/dope.html, Mar. 29, 2005.

U.S. Appl. No. 10/909,009, filed Jul. 29, 2004, entitled "Cluster Tool and Method for Process Integration in Manufacture of a Gate Structure of a Field Effect Transistor," Kumar et al.

U.S. Appl. No. 10/943,424, filed Sep. 17, 2004, entitled "Poly-silicon-Germanium Gate Stack and Method for Forming the Same," Paranjpe, et al.

U.S. Appl. No. 11/032,859, filed Jan. 10, 2005, entitled "Method for Producing Gate Stack Sidewall Spacers," Arghavani, et al.

U.S. Appl. No. 11/063,645, filed Feb. 22, 2005, entitled "In-Situ Dry Clean Chamber For Front End of Line Fabrication", Kao, et al.

U.S. Appl. No. 11/137,090, filed May 24, 2005, entitled "Substrate Support For In-Situ Dry Clean Chamber For Front End of Line Fabrication," Kao, et al.

U.S. Appl. No. 11/137,199, filed May 24, 2005, entitled "Lid Assembly For Front End of Line Fabrication," Kao, et al.

U.S. Appl. No. 11/137,609, filed May 24, 2005, entitled "Method For Front End of Line Fabrication," Kao, et al.

U.S. Appl. No. 11/179,274, filed Jul. 12, 2005, entitled "Thin tungsten silicide layer deposition and gate metal integration," Liu, et al.

Sze, VLSI Technology, McGraw-Hill Book Company, 3 pages, 1987.

* cited by examiner

CONTACT CLEAN BY REMOTE PLASMA AND REPAIR OF SILICIDE SURFACE

BACKGROUND OF THE INVENTION

1. Field of the Invention

Embodiments of the present invention generally relate to methods for forming semiconductor devices. More particularly, embodiments of the present invention generally relate to methods for preparing and forming metal contacts on a semiconductor substrate.

2. Description of the Related Art

Metal gates or contacts typically include a doped silicon surface, one or more barrier layers, one or more liner layers and bulk metal to complete the gate structure. The cleanliness of the substrate surface between layers is critical for reducing contact resistance and hence, optimal device performance. For logic devices, the contact is usually a silicide, such as nickel silicide (NiSi), cobalt silicide ($CoSi_2$), or titanium silicide ($TiSi_2$). Nickel silicide is getting more popular for smaller geometries, e.g. geometries having aspect ratios of about 10:1 or smaller, because NiSi is widely available and has a lower resistivity and lower contact resistance compared to other metal silicides.

In a typical fabrication process, the metal silicide is formed on a substrate in one vacuum environment and the substrate is transferred to another vacuum environment for further processing. As a result, the substrate can be subjected to oxidative conditions during the transfer. A clean process is typically conducted prior to the liner/barrier deposition to remove any oxides on the silicide surface which formed during transfer and exposure to the oxidative environment.

Conventional clean processes utilize physical etch techniques, i.e. sputtering, or chemical etch techniques. Sputtering techniques can damage the underlying surface due to resputtering of oxide onto the silicide surface. Sputtering techniques can also change the contact hole geometry due to the physical bombardment of ions on the substrate surface. For example, the contact opening can become widened or tapered which is sometimes referred to as "faceting." Conversely, chemical etch processes tend to cause less physical damage to the substrate surface, but can alter the surface composition. Such changes to the surface composition can lead to higher contact resistance. For example, the stoichiometry of the metal silicide can change when silicon atoms are removed during the clean process, thereby providing a metal rich silicide layer that can have a higher contact resistance.

The silicide integrity can recover by allowing either the metal atoms to migrate to the underlying regions or the silicon atoms to migrate from the underlying regions. Migration can be dependent on the composition of the silicide, the thickness of the silicide and temperature. Depending on such factors, migration can be very time consuming, on the order of 20 minutes or more, which is unacceptable to industry throughput requirements. Moreover, such migration can change the depth of the underlying regions (e.g. heavily doped isolation regions underneath the silicide regions) making those regions shallow, which can result in high leakage of current.

Therefore, there is a need for a new process for forming metal gates that can quickly recover the silicide integrity without altering device performance.

SUMMARY OF THE INVENTION

Methods for recovering a metal silicide and methods for making a metal contact that utilize the recovered metal silicide are provided. In at least one embodiment, a substrate having an at least partially oxidized metal silicide surface disposed thereon is cleaned to remove the oxidized regions to provide an altered metal silicide surface. The altered metal silicide surface is exposed to one or more silicon-containing compounds at conditions sufficient to recover the metal silicide surface.

In at least one other embodiment, a metal is disposed on at least a portion of a silicon-containing substrate in a vacuum environment. The silicon-containing substrate having the metal at least partially deposited thereon is annealed at conditions sufficient to provide a metal silicide layer. The silicon-containing substrate with the metal silicide layer is transferred from the vacuum environment to provide an at least partially oxidized metal silicide layer. The one or more oxidized regions of the metal silicide are cleaned to remove the oxidized regions, providing an altered metal silicide layer, and the altered metal silicide layer is exposed to a silicon-containing compound at conditions sufficient to recover the metal silicide layer.

In at least one embodiment for making a metal contact, a metal is deposited on at least a portion of a silicon-containing substrate in a vacuum environment. The silicon-containing substrate having the metal at least partially deposited thereon is annealed at conditions sufficient to provide a metal silicide layer. The silicon-containing substrate with the metal silicide layer is transferred from the vacuum environment to provide an at least partially oxidized metal silicide layer. The one or more oxidized regions of the metal silicide is cleaned to remove the oxidized regions, providing an altered metal silicide. The altered metal silicide layer is exposed to a silicon-containing compound at conditions sufficient to recover the metal silicide layer. A refractory metal nitride-containing layer is deposited on at least a portion of the restored metal silicide layer. A bulk metal layer is deposited on the refractory metal nitride-containing layer.

In at least one embodiment for making a metal contact, a metal is deposited on at least a portion of a silicon-containing substrate in a first vacuum environment. The silicon-containing substrate having the metal at least partially deposited thereon is annealed at conditions sufficient to provide a metal silicide layer. The silicon-containing substrate with the metal silicide layer is transferred from the first vacuum environment to a second vacuum environment comprising an integrated platform having a plurality of chambers in vacuum communication therewith. The silicon-containing substrate is at least partially oxidized during the transfer. The at least partially oxidized metal silicide layer is exposed to one or more reactive species in a first chamber on the integrated platform to remove the at least partially oxidized metal silicide layer, providing an altered metal silicide layer. The altered metal silicide layer is exposed to a silicon-containing compound in a second chamber on the integrated platform at conditions sufficient to recover the metal silicide layer. A refractory metal nitride-containing layer is deposited on at least a portion of the restored metal silicide layer in a third chamber disposed about the integrated platform. A bulk metal layer is deposited on the refractory metal nitride-containing layer.

BRIEF DESCRIPTION OF THE DRAWINGS

So that the manner in which the above recited features of the present invention can be understood in detail, a more particular description of the invention, briefly summarized above, can be had by reference to embodiments, some of which are illustrated in the appended drawings. It is to be noted, however, that the appended drawings illustrate only typical embodiments of this invention and are therefore not to be considered limiting of its scope, for the invention can admit to other equally effective embodiments.

DETAILED DESCRIPTION

As will be explained in greater detail below, a substrate having a contact surface at least partially disposed thereon is treated to remove metal oxides or other contaminants prior to contact level metallization. The term "contact surface" as used herein refers to a layer of material that includes a metal silicide that can form part of a gate electrode. In one or more embodiments, the metal silicide can be nickel silicide, cobalt silicide, titanium silicide or any combinations thereof. The metal silicide can also include tungsten, Ti/Co alloy silicide, Ti/Ni alloy silicide, Co/Ni alloy silicide and Ni/Pt silicide.

The term "substrate" as used herein refers to a layer of material that serves as a basis for subsequent processing operations and includes a "contact surface." For example, the substrate can include one or more conductive metals, such as aluminum, copper, tungsten, or combinations thereof. The substrate can also include one or more nonconductive materials, such as silicon, silicon oxide, doped silicon, germanium, gallium arsenide, glass, and sapphire. The substrate can also include dielectric materials such as silicon dioxide, organosilicates, and carbon doped silicon oxides. Further, the substrate can include any other materials such as metal nitrides and metal alloys, depending on the application. In one or more embodiments, the substrate can form part of an interconnect feature such as a plug, via, contact, line, and wire.

Moreover, the substrate is not limited to any particular size or shape. The substrate can be a round wafer having a 200 mm diameter or a 300 mm diameter. The substrate can also be any polygonal, square, rectangular, curved or otherwise non-circular workpiece, such as a glass substrate used in the fabrication of flat panel displays.

In one or more embodiments, the contact surface having one or more metal oxides is exposed to a chemical etch process capable of removing the metal oxide while minimizing change to the underlying metal silicide. The chemical etch process or "clean step" has a tendency to change or alter the surface composition of the metal silicide beneath the oxide and induce a higher resistive contact surface as mentioned above. In other words, a NiSi contact surface, for example, can be altered or changed to a metal rich contact surface, $Ni_xSi$ where x is greater than 1, that has a higher resistance than NiSi (i.e. the unaltered metal silicide surface). Conversely, the same NiSi contact surface can be altered or changed to a metal deficient or silicon rich contact surface, $NiSi_x$ where x is greater than 1, that has a higher resistance than NiSi. The term "altered metal suicide surface" as used herein refers to a metal silicide surface in which the stoichiometric relationship of the metal and the silicon has changed to provide a metal suicide surface having a higher resistance than the unaltered metal silicide surface.

One illustrative chemical etch process to remove metal oxides from the contact surface is a $NF_3/NH_3$ remote plasma process. The substrate to be cleaned is first cooled below about 65° C., such as between about 15° C. and about 50° C. The substrate is preferably maintained below 50° C. In one or more embodiments, the substrate is maintained at a temperature between about 22° C. (i.e. room temperature) and about 40° C. The ammonia ($NH_3$) and nitrogen trifluoride ($NF_3$) gases are then mixed to form a cleaning gas mixture. The amount of each gas introduced into the chamber is variable and can be adjusted to accommodate, for example, the thickness of the oxide layer to be removed, the geometry of the substrate being cleaned, the volume capacity of the plasma, the volume capacity of the chamber body, as well as the capabilities of the vacuum system coupled to the chamber body.

In one or more embodiments, the gases are added to provide a gas mixture having at least a 1:1 molar ratio of ammonia to nitrogen trifluoride. In one or more embodiments, the molar ratio of the gas mixture is at least about 3:1 (ammonia to nitrogen trifluoride). Preferably, the gases are introduced in the chamber 100 at a molar ratio of from about 5:1 (ammonia to nitrogen trifluoride) to about 30:1. More preferably, the molar ratio of the gas mixture is of from about 5:1 (ammonia to nitrogen trifluoride) to about 10:1. The molar ratio of the gas mixture can also fall between about 10:1 (ammonia to nitrogen trifluoride) and about 20:1.

Figure 1:
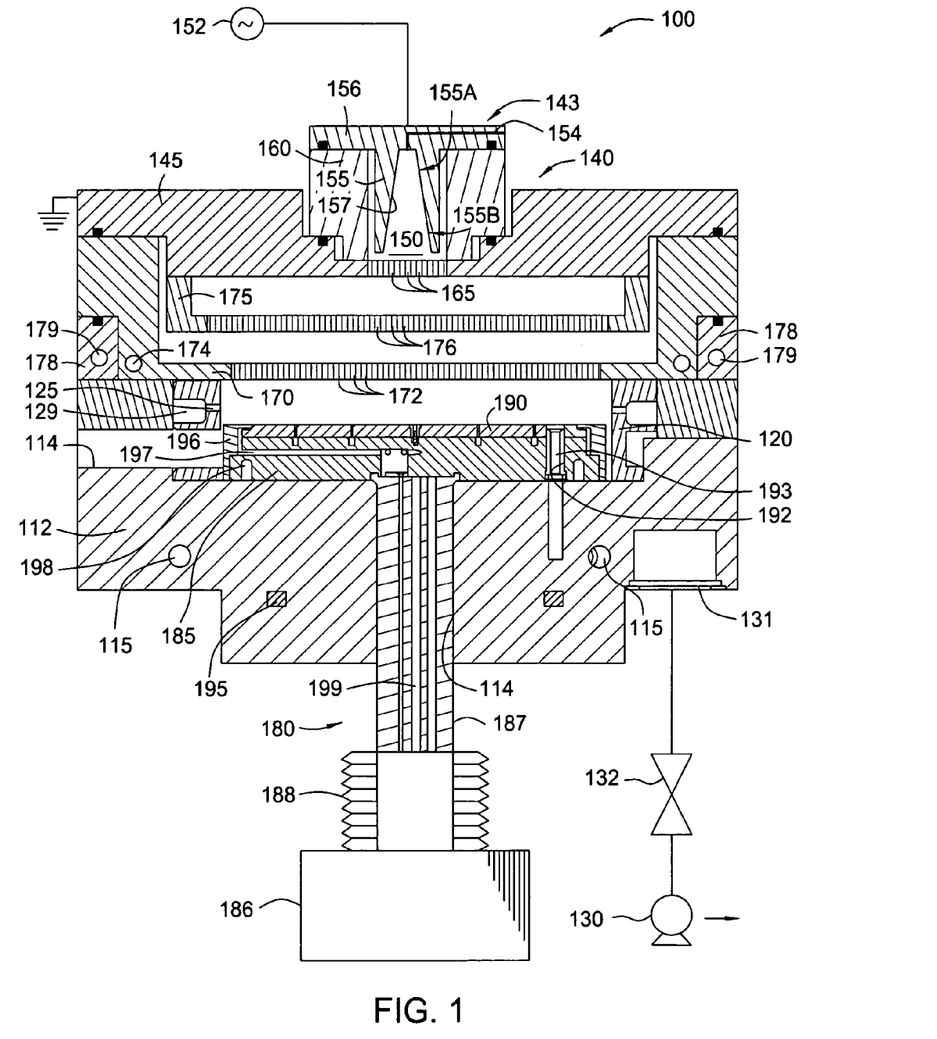
FIG. 1 is a cross section view of an illustrative clean chamber 100 for removing native oxides from a contact surface as described.

A purge gas or carrier gas can also be added to the gas mixture. Any suitable purge/carrier gas can be used, such as argon, helium, hydrogen, nitrogen, or mixtures thereof. Typically, the overall gas mixture is from about 0.05% to about 20% by volume of ammonia and nitrogen trifluoride. The remainder of the gas mixture is the purge/carrier gas. In one embodiment, the purge/carrier gas is first introduced into the chamber body 112 before the reactive gases to stabilize the pressure within the chamber body 112.

The operating pressure within the chamber can be variable. Typically, the pressure is maintained between about 500 mTorr and about 30 Torr. Preferably, the pressure is maintained between about 1 Torr and about 10 Torr. More preferably, the operating pressure is maintained between about 3 Torr and about 6 Torr.

An RF power between about 5 and about 600 Watts is preferred to ignite a plasma of the gas mixture. Preferably, the RF power is less than about 100 Watts. More preferably, the frequency at which the power is applied is very low, such as less than about 100 kHz. The frequency can range from about 50 kHz to about 90 kHz.

The plasma energy dissociates the ammonia and nitrogen trifluoride gases into reactive species, e.g. fluorine radicals and/or hydrogen radicals, that combine to form a highly reactive ammonia fluoride ($NH_4F$) compound and/or ammonium hydrogen fluoride ($NH_4F.HF$) in the gas phase. These molecules are then delivered from the remote plasma location to the substrate surface to be cleaned. A purge/carrier gas can be used to facilitate the delivery of the reactive species to the substrate.

After the thin film is formed on the substrate surface, the substrate is annealed to remove the thin film. The anneal temperature should be sufficient to dissociate or sublimate the thin film of into volatile ammonia and fluorine-containing products. Typically, a temperature of about 75° C. or more is used to effectively sublimate and remove the thin film from the substrate. Preferably, a temperature of about 100° C. or more is used, such as between about 115° C. and about 200° C. Additional details of this $NF_3/NH_3$ remote plasma process are described in U.S. patent application, Ser. No. 11/063,645 filed on Feb. 22, 2005.

After the metal oxides have been satisfactorily removed from the contact surface, the metal suicide contact surface is exposed to one or more silicon-containing compounds. The one or more silicon-containing compounds provide a source of silicon to react with the metal of the metal silicide to recover or regenerate the lower resistive metal suicide contact surface. The exposure of the metal silicide to one or more silicon-containing compounds is referred to as the "regeneration step." Preferably, the cleaned contact surface is exposed to one or more gaseous phase silicon-containing compounds, at conditions sufficient to recover the silicon content of the contact surface. Illustrative silicon-containing compounds include but are not limited to silane and disilane. Preferably, the silicon-containing compound is silane.

In one or more embodiments, the one or more silicon-containing compounds is provided to the contact surface at a rate of from about 100 SCCM to about 1,000 SCCM at a pressure of from about 100 mTorr to about 30 Torr and a temperature of from about 300° C. to about 600° C. In one or more embodiments, the pressure is between about 0.5 Torr and about 10 Torr. Preferably, the pressure ranges from about 0.5 Torr to about 5 Torr. In one or more embodiments, the temperature ranges from a low of about 300° C., 350° C., or 400° C. to a high of about 450° C., 500° C. or 600° C. Preferably, the temperature ranges from about 300° C. to about 400° C.

In one or more embodiments, the substrate is exposed to the one or more silicon-containing compounds for about 5 seconds to about 5 minutes, depending on the operating temperature, pressure and flow rate of the gas. For example, the substrate can be exposed for about 30 seconds to about 90 seconds. Preferably, the substrate is exposed for about 90 seconds or less. More preferably, the substrate is exposed for about 30 seconds or less. Afterwards, the recovered metal silicide contact surface is ready for metallization to form vias, lines, and other interconnect features.

FIG. 1 is a cross sectional view of an illustrative clean chamber 100 for conducting the clean step described. The chamber 100 is particularly useful for performing the plasma assisted dry etch process (i.e. the "clean step"). The chamber 100 provides both heating and cooling of a substrate surface without breaking vacuum. In one embodiment, the processing chamber 100 includes a chamber body 112, a lid assembly 140, and a support assembly 180. The lid assembly 140 is disposed at an upper end of the chamber body, and the support assembly 180 is at least partially disposed within the chamber body 112.

The chamber body 112 includes a slit valve opening 114 formed in a sidewall thereof to provide access to the interior of the processing chamber 100. The slit valve opening 114 is selectively opened and closed to allow access to the interior of the chamber body 112 by a wafer handling robot (not shown).

In one or more embodiments, the chamber body 112 includes a channel 115 formed therein for flowing a heat transfer fluid therethrough. The heat transfer fluid can be a heating fluid or a coolant and is used to control the temperature of the chamber body 112 during processing and substrate transfer. The temperature of the chamber body 112 is important to prevent unwanted condensation of the gas or byproducts on the chamber walls. Exemplary heat transfer fluids include water, ethylene glycol, or a mixture thereof. An exemplary heat transfer fluid may also include nitrogen gas.

The chamber body 112 can further include a liner 120 that surrounds the support assembly 180. The liner 120 is preferably removable for servicing and cleaning. The liner 120 can be made of a metal such as aluminum, a ceramic material, or any other process compatible material. The liner 120 can be bead blasted to increase surface roughness and/or surface area which increases the adhesion of any material deposited thereon, thereby preventing flaking of material which results in contamination of the processing chamber 100. In one or more embodiments, the liner 120 includes one or more apertures 125 and a pumping channel 129 formed therein that is in fluid communication with a vacuum system. The apertures 125 provide a flow path for gases into the pumping channel 129, which provides an egress for the gases within the processing chamber 100.

The vacuum system can include a vacuum pump 130 and a throttle valve 132 to regulate flow of gases through the processing chamber 100. The vacuum pump 130 is coupled to a vacuum port 131 disposed on the chamber body 112 and therefore, in fluid communication with the pumping channel 129 formed within the liner 120. The terms "gas" and "gases" are used interchangeably, unless otherwise noted, and refer to one or more precursors, reactants, catalysts, carrier, purge, cleaning, combinations thereof, as well as any other fluid introduced into the chamber body 112.

The lid assembly 140 includes at least two stacked components configured to form a plasma volume or cavity therebetween. In one or more embodiments, the lid assembly 140 includes a first electrode 143 ("upper electrode") disposed vertically above a second electrode 145 ("lower electrode") confining a plasma volume or cavity 150 therebetween. The first electrode 143 is connected to a power source 152, such as an RF power supply, and the second electrode 145 is connected to ground, forming a capacitance between the two electrodes 143, 145.

In one or more embodiments, the lid assembly 140 includes one or more gas inlets 154 (only one is shown) that are at least partially formed within an upper section 156 of the first electrode 143. The one or more process gases enter the lid assembly 140 via the one or more gas inlets 154. The one or more gas inlets 154 are in fluid communication with the plasma cavity 150 at a first end thereof and coupled to one or more upstream gas sources and/or other gas delivery components, such as gas mixers, at a second end thereof.

In one or more embodiments, the first electrode 143 has an expanding section 155 that houses the plasma cavity 150. In one or more embodiments, the expanding section 155 is an annular member that has an inner surface or diameter 157 that gradually increases from an upper portion 155A thereof to a lower portion 155B thereof. As such, the distance between the first electrode 143 and the second electrode 145 is variable. That varying distance helps control the formation and stability of the plasma generated within the plasma cavity 150.

In one or more embodiments, the expanding section 155 resembles a cone or "funnel." In one or more embodiments, the inner surface 157 of the expanding section 155 gradually slopes from the upper portion 155A to the lower portion 155B of the expanding section 155. The slope or angle of the inner diameter 157 can vary depending on process requirements and/or process limitations. The length or height of the expanding section 155 can also vary depending on specific process requirements and/or limitations.

As mentioned above, the expanding section 155 of the first electrode 143 varies the vertical distance between the first electrode 143 and the second electrode 145 because of the gradually increasing inner surface 157 of the first electrode 143. That variable distance is directly related to the power level within the plasma cavity 150. Not wishing to be bound by theory, the variation in distance between the two electrodes 143, 145 allows the plasma to find the necessary power level to sustain itself within some portion of the plasma cavity 150 if not throughout the entire plasma cavity 150. The plasma within the plasma cavity 150 is therefore less dependent on pressure, allowing the plasma to be generated and sustained within a wider operating window. As such, a more repeatable and reliable plasma can be formed within the lid assembly 140.

The expanding section 155 is in fluid communication with the gas inlet 154 as described above. The first end of the one or more gas inlets 154 can open into the plasma cavity 150 at the upper most point of the inner diameter of the expanding section 155. Similarly, the first end of the one or more gas inlets 154 can open into the plasma cavity 150 at any height interval along the inner diameter 157 of the expanding section 155. Although not shown, two gas inlets 154 can be disposed at opposite sides of the expanding section 155 to create a swirling flow pattern or "vortex" flow into the expanding section 155 which helps mix the gases within the plasma cavity 150. A more detailed description of such a flow pattern and gas inlet arrangements is provided by U.S. Patent Application No. 20030079686, filed on Dec. 21, 2001, which is incorporated by reference herein.

The lid assembly 140 can further include an isolator ring 160 to electrically isolate the first electrode 143 from the second electrode 145. The isolator ring 160 can be made from aluminum oxide or any other insulative, process compatible material. Preferably, the isolator ring 160 surrounds or substantially surrounds at least the expanding section 155.

The lid assembly 140 can further include a distribution plate 170 and blocker plate 175 adjacent the second electrode 145. The second electrode 145, distribution plate 170 and blocker plate 175 can be stacked and disposed on a lid rim 178 which is connected to the chamber body 112. As is known in the art, a hinge assembly (not shown) can be used to couple the lid rim 178 to the chamber body 112. The lid rim 178 can include an embedded channel or passage 179 for housing a heat transfer medium. The heat transfer medium can be used for heating, cooling, or both, depending on the process requirements.

In one or more embodiments, the second electrode or top plate 145 can include a plurality of gas passages or apertures 165 formed beneath the plasma cavity 150 to allow gas from the plasma cavity 150 to flow therethrough. The distribution plate 170 is substantially disc-shaped and also includes a plurality of apertures 172 or passageways to distribute the flow of gases therethrough. The apertures 172 can be sized and positioned about the distribution plate 170 to provide a controlled and even flow distribution to the chamber body 112 where the substrate to be processed is located. Furthermore, the apertures 172 prevent the gas(es) from impinging directly on the substrate surface by slowing and re-directing the velocity profile of the flowing gases, as well as evenly distributing the flow of gas to provide an even distribution of gas across the surface of the substrate.

In one or more embodiments, the distribution plate 170 includes one or more embedded channels or passages 174 for housing a heater or heating fluid to provide temperature control of the lid assembly 140. A resistive heating element (not shown) can be inserted within the passage 174 to heat the distribution plate 170. A thermocouple can be connected to the distribution plate 170 to regulate the temperature thereof. The thermocouple can be used in a feedback loop to control electric current applied to the heating element, as described above.

Alternatively, a heat transfer medium can be passed through the passage 174. The one or more passages 174 can contain a cooling medium, if needed, to better control temperature of the distribution plate 170 depending on the process requirements within the chamber body 112. Any heat transfer medium may be used, such as nitrogen, water, ethylene glycol, or mixtures thereof, for example.

In one or more embodiments, the lid assembly 140 can be heated using one or more heat lamps (not shown). Typically, the heat lamps are arranged about an upper surface of the distribution plate 170 to heat the components of the lid assembly 140 including the distribution plate 170 by radiation.

The blocker plate 175 is optional and would be disposed between the second electrode 145 and the distribution plate 170. Preferably, the blocker plate 175 is removably mounted to a lower surface of the second electrode 145. The blocker plate 175 should make good thermal and electrical contact with the second electrode 145. In one or more embodiments, the blocker plate 175 can be coupled to the second electrode 145 using a bolt or similar fastener. The blocker plate 175 can also be threaded or screwed onto an out diameter of the second electrode 145.

The blocker plate 175 includes a plurality of apertures 176 to provide a plurality of gas passages from the second electrode 145 to the distribution plate 170. The apertures 176 can be sized and positioned about the blocker plate 175 to provide a controlled and even flow distribution the distribution plate 170.

The support assembly 180 can include a support member 185 to support a substrate (not shown in this view) for processing within the chamber body 112. The support member 185 can be coupled to a lift mechanism 186 through a shaft 187 which extends through a centrally-located opening 114 formed in a bottom surface of the chamber body 112. The lift mechanism 186 can be flexibly sealed to the chamber body 112 by a bellows 188 that prevents vacuum leakage from around the shaft 187. The lift mechanism 186 allows the support member 185 to be moved vertically within the chamber body 112 between a process position and a lower, transfer position. The transfer position is slightly below the opening of the slit valve 114 formed in a sidewall of the chamber body 112.

In one or more embodiments, the support member 185 has a flat, circular surface or a substantially flat, circular surface for supporting a substrate to be processed thereon. The support member 185 is preferably constructed of aluminum. The support member 185 can include a removable top plate 190 made of some other material, such as silicon or ceramic material, for example, to reduce backside contamination of the substrate.

In one or more embodiments, the substrate (not shown) may be secured to the support member 185 using a vacuum chuck. In one or more embodiments, the substrate (not shown) may be secured to the support member 185 using an electrostatic chuck. Preferably, the substrate is secured using an electrostatic chuck. An electrostatic chuck typically includes at least a dielectric material that surrounds an electrode (not shown), which may be located on an upper surface of the support member 185 or formed as an integral part of the support member 185. The dielectric portion of the chuck electrically insulates the chuck electrode from the substrate and from the remainder of the support assembly 180.

The support member 185 can include one or more bores 192 formed therethrough to accommodate a lift pin 193. Each lift pin 193 is typically constructed of ceramic or ceramic-containing materials, and are used for substrate-handling and transport. The lift pin 193 is moveable within its respective bore 192 by engaging an annular lift ring 195 disposed within the chamber body 112. The lift ring 195 is movable such that the upper surface of the lift-pin 193 can be located above the substrate support surface of the support member 185 when the lift ring 195 is in an upper position. Conversely, the upper surface of the lift-pins 193 is located below the substrate support surface of the support member 185 when the lift ring 195 is in a lower position. Thus, part of each lift-pin 193 passes through its respective bore 192 in the support member 185 when the lift ring 195 moves from either the lower position to the upper position.

The support assembly 180 can further include an edge ring 196 disposed about the support member 185. In one or more embodiments, the edge ring 196 is an annular member that is adapted to cover an outer perimeter of the support member 185 and protect the support member 185 from deposition. The edge ring 196 can be positioned on or adjacent the support member 185 to form an annular purge gas channel between the outer diameter of support member 185 and the inner diameter of the edge ring 196. The annular purge gas channel can be in fluid communication with a purge gas conduit 197 formed through the support member 185 and the shaft 187. Preferably, the purge gas conduit 197 is in fluid communication with a purge gas supply (not shown) to provide a purge gas to the purge gas channel. Any suitable purge gas such as nitrogen, argon, or helium, may be used alone or in combination. In operation, the purge gas flows through the conduit 197, into the purge gas channel, and about an edge of the substrate disposed on the support member 185. Accordingly, the purge gas working in cooperation with the edge ring 196 prevents deposition at the edge and/or backside of the substrate.

The temperature of the support assembly 180 can be controlled by a fluid circulated through a fluid channel 198 embedded in the body of the support member 185. In one or more embodiments, the fluid channel 198 is in fluid communication with a heat transfer conduit 199 disposed through the shaft 187 of the support assembly 180. Preferably, the fluid channel 198 is positioned about the support member 185 to provide a uniform heat transfer to the substrate receiving surface of the support member 185. The fluid channel 198 and heat transfer conduit 199 can flow heat transfer fluids to either heat or cool the support member 185. Any suitable heat transfer fluid may be used, such as water, nitrogen, ethylene glycol, or mixtures thereof. The support assembly 185 can further include an embedded thermocouple (not shown) for monitoring the temperature of the support surface of the support member 185. For example, a signal from the thermocouple may be used in a feedback loop to control the temperature or flowrate of the fluid circulated through the fluid channel 198.

The support member 185 can be moved vertically within the chamber body 112 so that a distance between support member 185 and the lid assembly 140 can be controlled. A sensor (not shown) can provide information concerning the position of support member 185 within chamber 100. An example of a lifting mechanism for the support member 185 is described in detail in U.S. Pat. No. 5,951,776, issued Sep. 14, 1999 to Selyutin et al., entitled "Self-Aligning Lift Mechanism," which is hereby incorporated by reference in it entirety.

In operation, the support member 185 can be elevated to a close proximity of the lid assembly 140 to control the temperature of the substrate being processed. As such, the substrate can be heated via radiation emitted from the distribution plate 170. Alternatively, the substrate can be lifted off the support member 185 to close proximity of the heated lid assembly 140 using the lift pins 193 activated by the lift ring 195. Additional details of the chamber and its many parts are further shown and described in U.S. patent application Ser. No. 11/063,645 filed on Feb. 22, 2005.

A system controller (not shown) can be used to regulate the operations of the processing chamber 100. The system controller can operate under the control of a computer program stored on a hard disk drive of a computer. For exemplary, the computer program can dictate the process sequencing and timing, mixture of gases, chamber pressures, RF power levels, susceptor positioning, slit valve opening and closing, wafer cooling and other parameters of a particular process. The interface between a user and the system controller can be made via a CRT monitor and light pen (not shown). In a preferred embodiment, two monitors are used, one monitor mounted in the clean room wall for the operators and the other monitor behind the wall for the service technicians. Also preferred is that both monitors simultaneously display the same information but only one light pen is enabled. The light pen detects light emitted by the CRT display with a light sensor in the tip of the pen. To select a particular screen or function, the operator can touch a designated area of the display screen and push the button on the pen. The display screen generally confirms communication between the light pen and the touched area by changing its appearance, i.e. highlight or color, or displaying a new menu or screen.

A variety of processes can be implemented using a computer program product that runs on, for example, the system controller. The computer program code can be written in any conventional computer readable programming language such as 68000 assembly language, C, C++, or Pascal. Suitable program code can be entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled library routines. To execute the linked compiled object code, the system user invokes the object code, causing the computer system to load the code in memory, from which the CPU reads and executes the code to perform the tasks identified in the program.

The regeneration step can be conducted in the same chamber 100 described above. The regeneration step can also be done in a separate processing chamber. Further, the regeneration step can be performed within a deposition chamber in-situ prior to depositing one or more liner, barrier, adhesion, or bulk fill layers on the cleaned contact surface. Illustrative deposition chambers include but are not limited to atomic layer deposition (ALD) chambers, cyclical layer deposition (CLD) chambers, physical vapor deposition (PVD) chambers, and chemical vapor deposition (CVD) chambers.

In one or more embodiments, the clean chamber and/or the chamber for conducting the regeneration step, if a separate chamber, can be integrated into a multi-processing platform, such as an Endura® platform available from Applied Materials, Inc. located in Santa Clara, Calif. Such a processing platform is capable of performing several processing operations without breaking vacuum. Details of an illustrative Endura® platform are described in U.S. Pat. Nos. 5,186,718 and 6,558,509.

Figure 2:
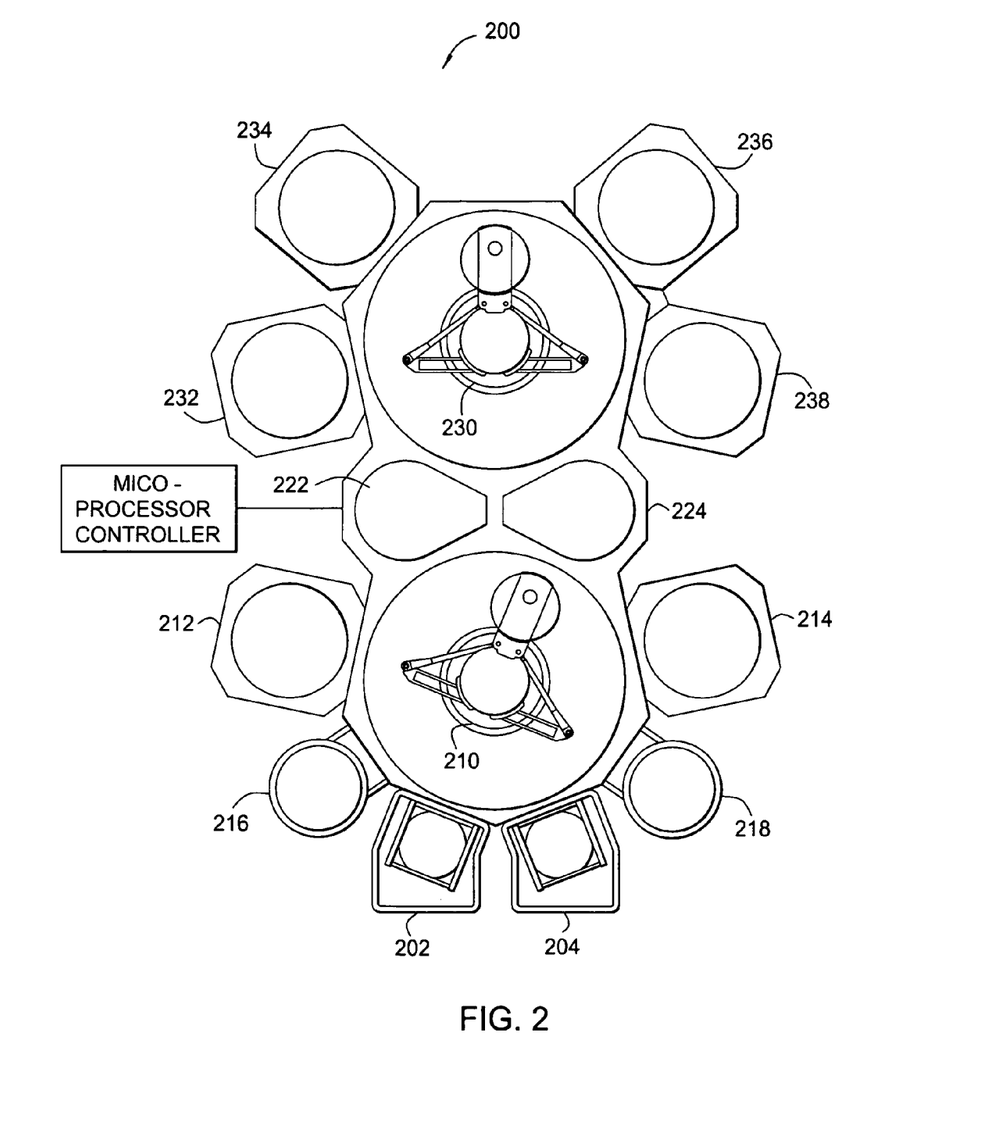
FIG. 2 is a schematic top-view diagram of an illustrative multi-chamber processing system 200.

FIG. 2 is a schematic top-view diagram of an illustrative multi-chamber processing system 200 that can be adapted to perform processes as disclosed herein. The system 200 can include one or more load lock chambers 202, 204 for transferring substrates into and out of the system 200. Typically, since the system 200 is under vacuum, the load lock chambers 202, 204 can "pump down" the substrates introduced into the system 200. A first robot 210 can transfer the substrates between the load lock chambers 202, 204, and a first set of one or more substrate processing chambers 212, 214, 216, 218 (four are shown). Each processing chamber 212, 214, 216, 218, can be outfitted to perform a number of substrate processing operations including the dry etch processes described herein in addition to cyclical layer deposition (CLD), atomic layer deposition (ALD), chemical vapor deposition (CVD), physical vapor deposition (PVD), etch, pre-clean, degas, orientation and other substrate processes.

The first robot 210 can also transfer substrates to/from one or more transfer chambers 222, 224. The transfer chambers 222, 224 can be used to maintain ultrahigh vacuum conditions while allowing substrates to be transferred within the system 200. A second robot 230 can transfer the substrates between the transfer chambers 222, 224 and a second set of one or more processing chambers 232, 234, 236, 238. Similar to processing chambers 212, 214, 216, 218, the processing chambers 232, 234, 236, 238 can be outfitted to perform a variety of substrate processing operations including the dry etch processes described herein in addition to cyclical layer deposition (CLD), atomic layer deposition (ALD), chemical vapor deposition (CVD), physical vapor deposition (PVD), etch, pre-clean, degas, and orientation, for example. Any of the substrate processing chambers 212, 214, 216, 218, 232, 234, 236, 238 can be removed from the system 200 if not necessary for a particular process to be performed by the system 200.

Figure 3A:
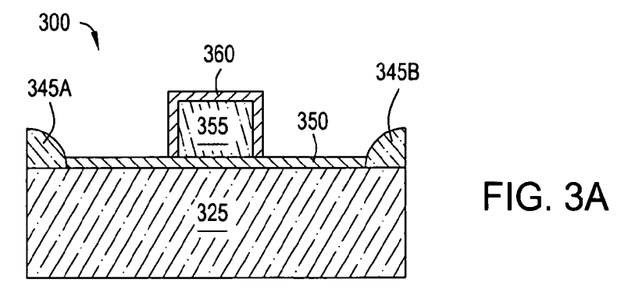
FIGS. 3A-3N are sectional schematic views of an illustrative fabrication sequence for forming an illustrative active electronic device, such as a FET structure 300.
Figure 3B:
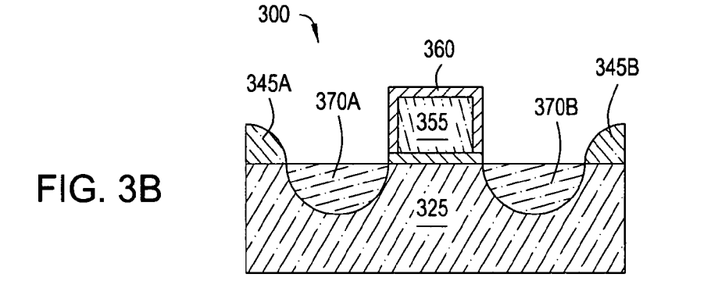
Figure 3C:
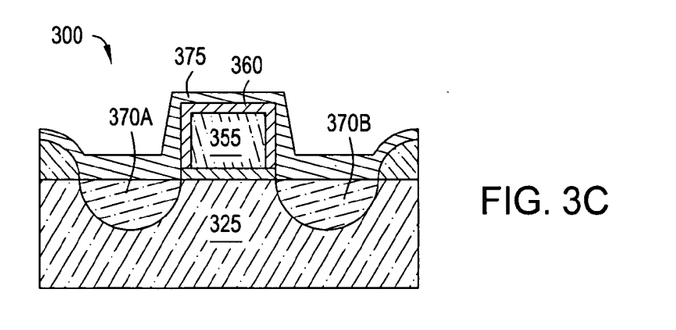
Figure 3D:
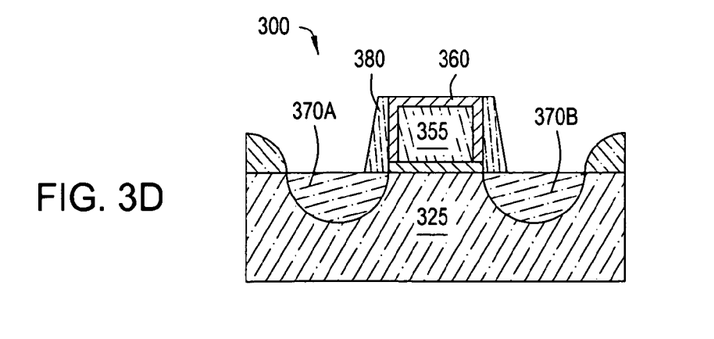
Figure 3E:
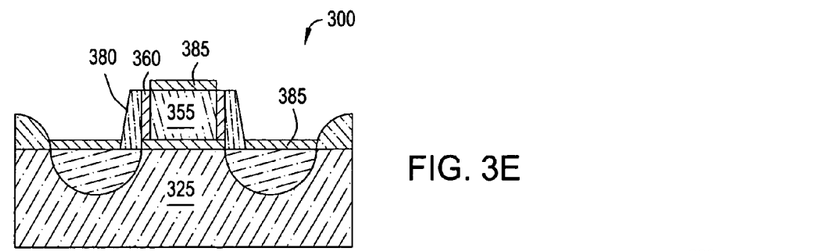
Figure 3F:
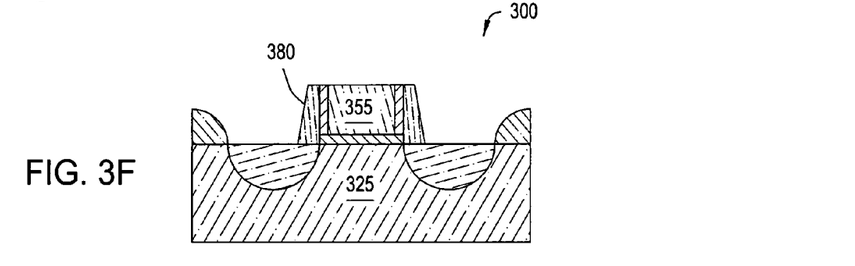
Figure 3G:
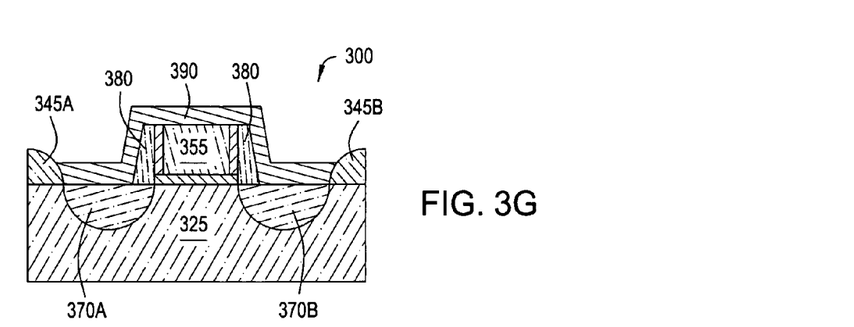
Figure 3H:
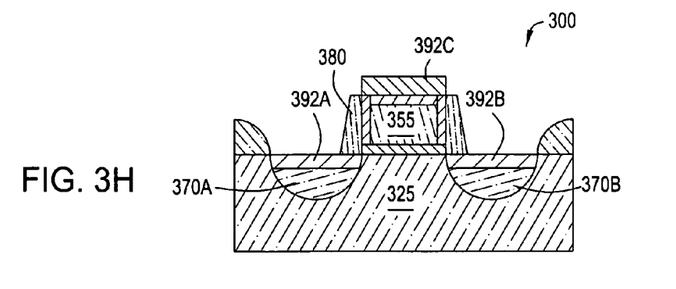
Figure 3I:
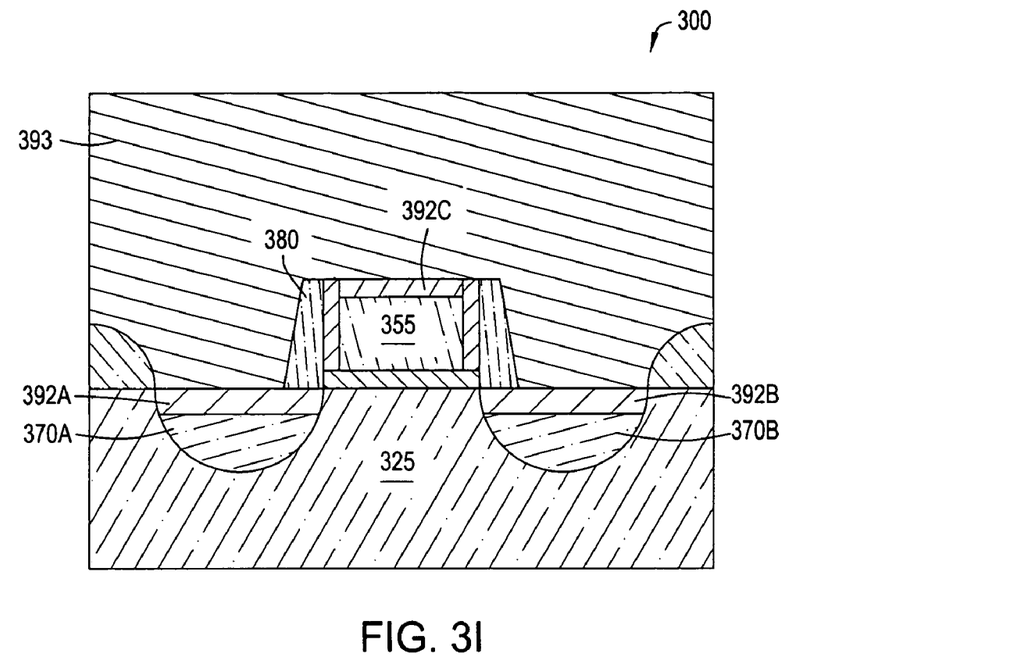
Figure 3J:
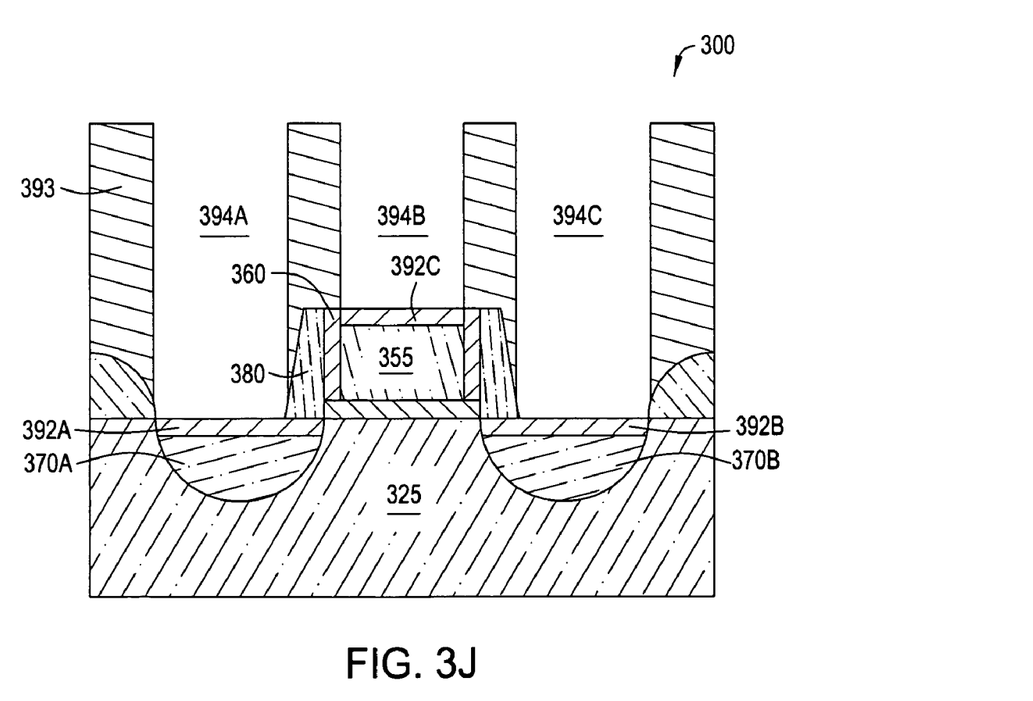
Figure 3K:
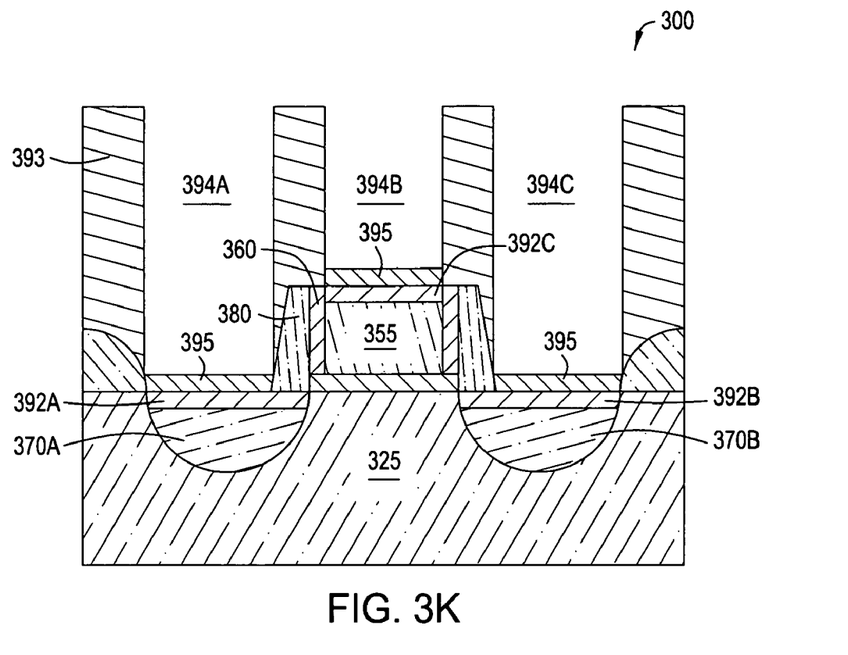
Figure 3L:
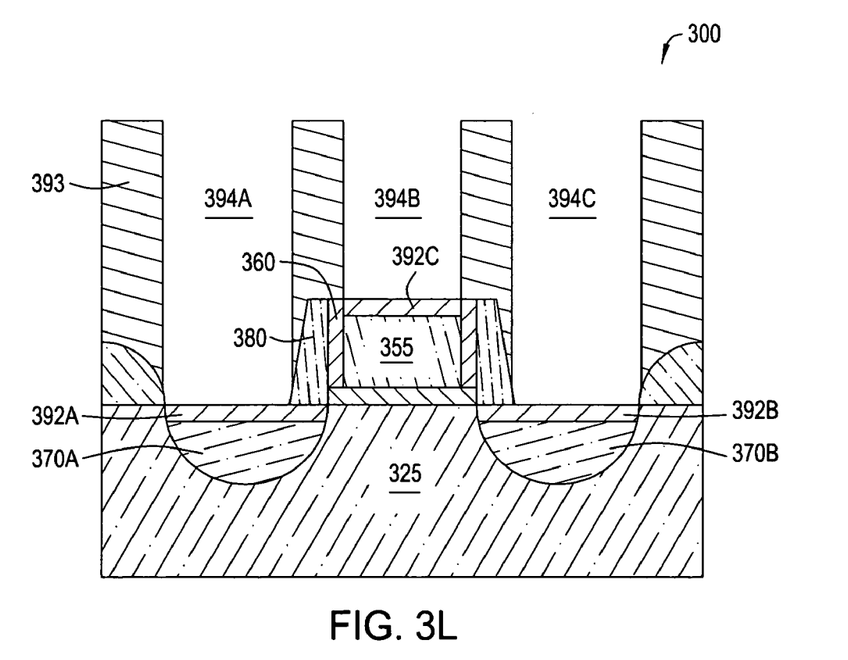
Figure 3M:
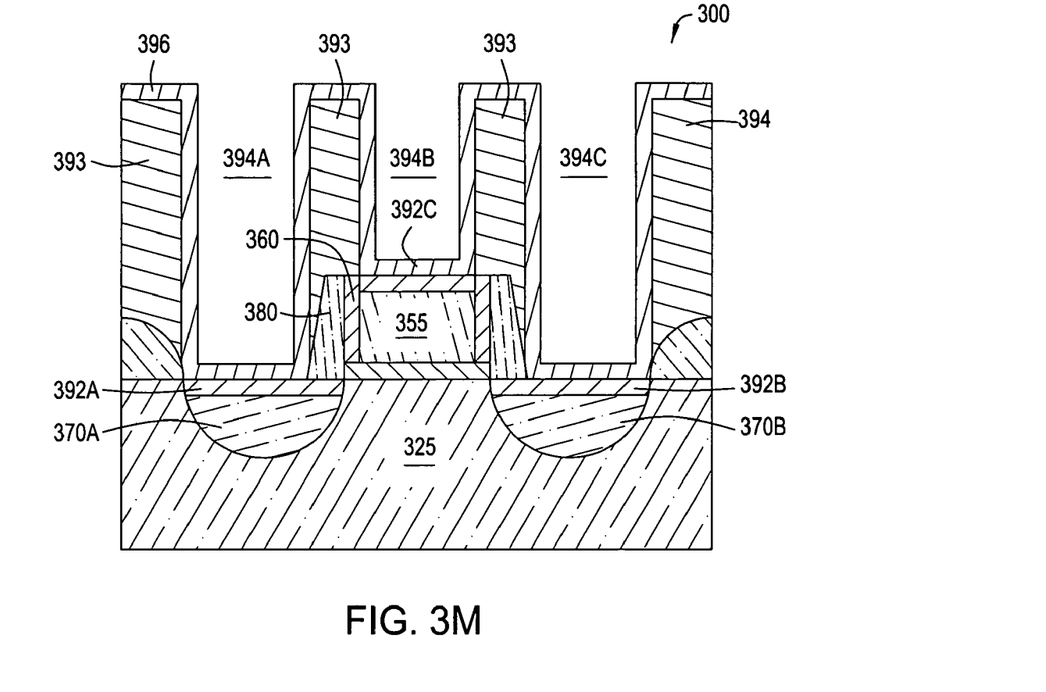
Figure 3N:
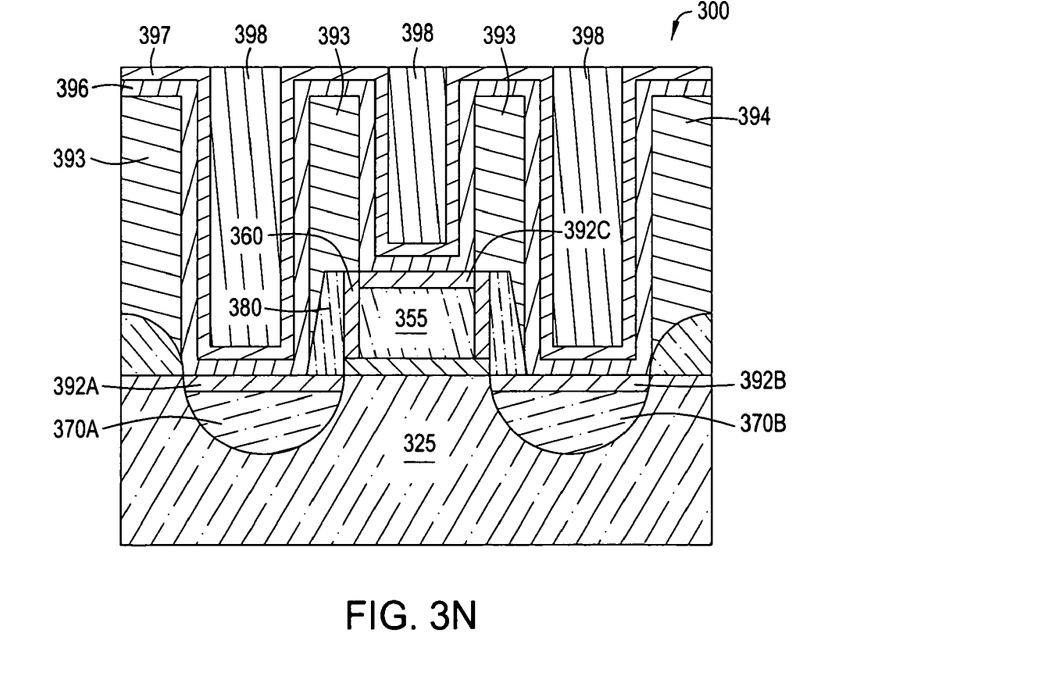

FIGS. 3A-3N are sectional schematic views of an illustrative fabrication sequence for forming an active electronic device, such as a FET structure 300 utilizing the contact clean and regeneration processes described. The FET structure 300 can include a combination of (i) dielectric layers, such as silicon dioxide, organosilicate, carbon doped silicon oxide, phosphosilicate glass (PSG), borophosphosilicate glass (BPSG), silicon nitride, or combinations thereof; (ii) semiconducting layers such as doped polysilicon, and n-type or p-type doped monocrystalline silicon; and (iii) electrical contacts and interconnect lines formed from layers of metal or metal silicide, such as tungsten, tungsten silicide, titanium, titanium silicide, cobalt silicide, nickel silicide, or combinations thereof. Each layer can be formed using any one or more depositions techniques, such as atomic layer deposition (ALD), cyclical layer deposition (CLD), physical vapor deposition (PVD), chemical vapor deposition (CVD), plasma enhanced chemical vapor deposition (PECVD), evaporation, for example.

Fabrication of the active electronic device begins by forming electrical isolation structures that electrically isolate the active electronic device from other devices. There are several types of electrical isolation structures as generally described in VLSI Technology, Second Edition, Chapter 11, by S. M. Sze, McGraw-Hill Publishing Company (1988), which is incorporated herein by reference. Referring to FIGS. 3A-3N, the illustrative FET structure 300 can be formed on a semiconductor material, for example a silicon or gallium arsenide substrate 325. Preferably, the substrate 325 is a silicon wafer having a <100> crystallographic orientation and a diameter of 150 mm (6 inches), 200 mm (8 inches), or 300 mm (12 inches). A field oxide layer (not shown) having a thickness of about 2,000 angstroms is first grown over the entire substrate 325, and portions of the oxide layer are removed to form the field oxide barriers 345A,B which surround exposed regions in which the electrically active elements of the device are formed. The exposed regions are thermally oxidized to form a thin gate oxide layer 350 having a thickness of from about 50 to 300 angstroms. A polysilicon layer is then deposited, patterned, and etched to create a gate electrode 355. The surface of the polysilicon gate electrode 355 can be reoxidized to form an insulating dielectric layer 360, providing the structure shown in FIG. 3A.

Referring to FIG. 3B, the source and drain 370A,B are next formed by doping the appropriate regions with one or more suitable dopant atoms. For example, on p-type substrates, an n-type dopant species comprising arsenic or phosphorous is used. Typically the doping is performed by an ion implanter and can include, for example, phosphorous ($^{31}$P) at a concentration of about $10^{13}$ atoms/cm$^2$ at an energy level of from about 30 to 80 Kev, or Arsenic ($^{75}$As) at a dose of from about $10^{15}$ to $10^{17}$ atoms/cm$^2$ and an energy of from 10 to 100 Kev. After the implantation process, the dopant is driven into the substrate 325 by heating the substrate, for example, in a rapid thermal processing (RTP) apparatus. Thereafter, the oxide layer 350 (shown in FIG. 3A) covering the source and drain regions 370A, B is stripped in a conventional stripping process to remove any impurities caused by the implantation process which are trapped in the oxide layer, providing the structure shown in FIG. 3B.

Referring to FIGS. 3C and 3D, a silicon nitride layer 375 is deposited on the gate electrode 355 and the surfaces on the substrate 325 by low-pressure chemical vapor deposition (LPCVD) using a gas mixture of SiH$_2$, Cl$_2$, and NH$_3$. The silicon nitride layer 375 is then etched using reactive ion etching (RIE) techniques to form nitride spacers 380 on the sidewall of the gate electrode 355, as shown in FIG. 3D. It should be noted that the electrical isolation sidewall spacers 380 and overlayers can be fabricated from other materials, such as silicon oxide. The silicon oxide layers used to form sidewall spacers 380 are typically deposited by CVD or PECVD from a feed gas of tetraethoxysilane (TEOS) at a temperature in the range of from about 600° C. to about 1,000° C.

Referring to FIG. 3E, a native silicon oxide layer 385 can be formed on exposed silicon surfaces by exposure to atmosphere during transfer of the substrate 325 between processing chambers and/or processing systems. The native silicon oxide layer 385 must be removed prior to forming conductive metal silicide contacts on the gate 355, source 370A, and drain 370B to improve the alloying reaction and electrical conductivity of the metal suicide formed. The native silicon oxide layer 385 can increase the electrical resistance of the semiconducting material, and adversely affect the silicidation reaction of the silicon and metal layers that are subsequently deposited. Therefore, it is necessary to remove this native silicon dioxide layer 385 prior to forming metal silicide contacts or conductors for interconnecting active electronic devices. A clean process such as the NH$_3$/NF$_3$ clean process described above can be used to remove the native silicon oxide layers 385 to expose the source 370A, drain 370B, and the top surface of the gate electrode 355 as shown in FIG. 3F.

Referring to FIG. 3G, a PVD sputtering process can be used to deposit a layer of metal 390. Suitable conductive metals include cobalt, titanium, nickel, tungsten, platinum, and any other metal that has a low contact resistance and that can form a reliable metal silicide contact on both polysilicon and monocrystalline silicon. Alloys or a combination of two or more metals can also be used, as described above.

Conventional furnace annealing is then used to anneal the metal and silicon layers to form metal silicide in regions in which the metal layer 390 is in contact with silicon. The anneal is typically performed in a separate processing system. Accordingly, a protective cap layer (not shown) can be deposited over the metal 390 prior to the anneal step. The cap layer is typically of a nitride-containing material and can include titanium nitride, tungsten nitride, tantalum nitride, hafnium nitride, and silicon nitride. The cap layer can be deposited by any deposition process, preferably by PVD. Annealing typically involves heating the substrate 325 to a temperature of between 500° C. and 800° C. in an atmosphere of nitrogen for about 30 minutes. Alternatively, a rapid thermal annealing process can be used in which the substrate 325 is rapidly heated to about 1,000° C. for about 30 seconds.

The cap layer and unreacted portions of the metal layer 390 can be removed by a wet etch using aqua regia, (HCl and HNO$_3$) which removes the metal without attacking the metal silicide, the spacer 380, or the field oxide 345A,B, thus leaving a self-aligned metal silicide contact 392A on the source 370A, a self-aligned metal silicide contact 392B on the drain 370B, and a self-aligned metal silicide contact 392C on the gate 355, as shown in FIG. 3H. The spacers 380 electrically isolate the metal silicide layer 392C formed on the top surface of the gate 355 from the other metal silicide layers 392A, 392B deposited over the source 370A and drain 370B.

Thereafter, an insulating cover layer 393 of, for example, silicon oxide, carbon doped silicon, BPSG, or PSG, can be deposited on the metal silicide 392A, 392B, 392C (i.e. "contact surfaces"). The insulating cover layer 393 can be deposited by chemical vapor deposition techniques in a CVD chamber, in which the material condenses from a feed gas at low or atmospheric pressure, as for example, described in commonly assigned U.S. Pat. No. 5,500,249, issued Mar. 19, 1996, which is incorporated herein by reference. Thereafter, the structure 300 is annealed at glass transition temperatures to form a smooth planarized surface.

The insulating cover layer 393 is then etched to form contact holes or vias 394A, 394B, 394C. The structure 300 is then typically transferred to a wet clean chamber to remove any etch residuals. As a result of this transfer, native oxides 395 can form on the contact surfaces 392A, 392B, 392C, as shown in FIG. 3K.

Next, the structure 300 can be subjected to a clean process to remove the native oxides 395 to remove native silicon oxides as shown in FIG. 3L. Preferably, the native oxides 395 are removed using the NF$_3$/NH$_3$ remote plasma process described. Thereafter, the cleaned structure 300 is treated with a silicon-containing compound to recover the metal silicide contact surface 392A, 392B, 392C as described.

After the metal silicide contact surface 392A, 392B, 392C has been recovered, one or more liner or barrier layers 396 can be deposited on the substrate, as shown in FIG. 3M. The barrier layer 396 can contain any one or more refractory metals deposited by any deposition technique capable of providing good step coverage. For example, the barrier layer 396 can include titanium, tantalum, or tungsten deposited by one or more physical vapor deposition techniques. The barrier layer 396 can also include one or more refractory metal nitrides. Preferably, the barrier layer 396 is titanium nitride deposited by one or more chemical vapor deposition techniques.

In one or more embodiments, a first layer 396 (i.e. "liner" layer) containing a refractory metal can be deposited followed by a second layer 397 (i.e. "barrier" layer) containing a refractory metal nitride, as shown in FIG. 3N. For example, a titanium liner layer can be deposited followed by a titanium nitride layer. Of course, in either layer, the refractory metal can be tantalum or tungsten in lieu of or in addition to titanium.

Thereafter, the contact holes and/or vias 394A, 394B, 394C are at least partially filled with a bulk metal layer 398, as shown in FIG. 3N. Illustrative metals include, but are not limited to copper, tungsten, titanium, and tantalum. Preferably, the bulk metal layer 398 includes tungsten deposited by one or more chemical vapor deposition techniques.

Although the process sequence above has been described in relation to the formation of a FET device, the etch process and silicide regeneration process described can also be used to form other semiconductor structures and devices that have other metal silicide layers, for example, suicides of tungsten, tantalum, molybdenum. The cleaning process can also be used prior to the deposition of layers of different metals including, for example, aluminum, copper, cobalt, nickel, silicon, titanium, palladium, hafnium, boron, tungsten, tantalum, or mixtures thereof. Further, the cleaning process can be used to remove oxides formed on a substrate surface in addition to native oxides. For example, oxides can result due to chemical etch processes performed on the substrate, photoresist strip processes performed on the substrate, wet clean processes, and any other oxygen based process.

Various terms have been defined above. To the extent a term used in a claim is not defined above, it should be given the broadest definition persons in the pertinent art have given that term as reflected in at least one printed publication or issued patent. Certain embodiments and features have also been described using a set of numerical upper limits and a set of numerical lower limits. It should be appreciated that ranges from any lower limit to any upper limit are contemplated unless otherwise indicated. Certain lower limits, upper limits and ranges appear in one or more claims below. All numerical values are "about" or "approximately" the indicated value, and take into account experimental error and variations that would be expected by a person having ordinary skill in the art. Furthermore, all patents, test procedures, and other documents cited herein are fully incorporated by reference to the extent such disclosure is not inconsistent with this application and for all jurisdictions in which such incorporation is permitted.

While the foregoing is directed to embodiments of the present invention, other and further embodiments of the invention can be devised without departing from the basic scope thereof, and the scope thereof is determined by the claims that follow.

The invention claimed is:

1. A method for forming a metal silicide, comprising:
positioning a substrate having an at least partially oxidized metal silicide surface disposed thereon in a processing chamber;
cleaning one or more oxidized regions of the at least partially oxidized metal silicide surface with reactive species to remove the oxidized regions to provide an altered metal silicide surface; and
exposing the altered metal silicide surface to one or more silicon-containing compounds at conditions sufficient to recover the metal silicide surface, wherein the one or more silicon-containing compounds and the reactive species are different, wherein cleaning the one or more oxidized regions comprises:
supporting the substrate having the at least partially oxidized metal silicide surface disposed thereon in a vacuum chamber;
generating the reactive species from a gas mixture within the chamber;
cooling the substrate within the chamber;
directing the reactive species to the cooled substrate to react with the native oxides thereon and form a film on the at least partially oxidized metal silicide surface; and
heating the substrate within the chamber to vaporize the film.

2. The method of claim 1, wherein the film is a salt comprising nitrogen and fluorine atoms.

3. The method of claim 1, wherein the gas mixture comprises ammonia and nitrogen fluoride.

4. The method of claim 1, wherein cooling the substrate comprises flowing a coolant through a support assembly having the substrate disposed thereon and maintaining the substrate temperature below about 50° C.

5. The method of claim 1, wherein heating the substrate comprises positioning the substrate adjacent a heated gas distribution plate disposed within the vacuum chamber and maintaining the substrate temperature above about 100° C.

6. The method of claim 1, wherein the one or more silicon-containing compounds comprises silane gas.

7. The method of claim 1, wherein the altered metal silicide surface is exposed to the one or more silicon-containing compounds for about 90 seconds or less.

8. The method of claim 1, wherein the conditions sufficient to recover the metal silicide surface comprise a temperature from about 250° C. to about 450° C. and a pressure from about 0.5 Torr to about 10 Torr.

9. The method of claim 1, wherein the altered metal silicide surface comprises $Ni_xSi$, where x is greater than 1 and the recovered metal silicide surface comprises NiSi.

10. A method for forming a metal silicide, comprising:
depositing a metal on at least a portion of a silicon-containing substrate in a vacuum environment;
annealing the silicon-containing substrate having the metal at least partially deposited thereon at conditions sufficient to provide a metal silicide layer deposit oxide;
transferring the silicon-containing substrate with the metal silicide layer from the vacuum environment to provide an at least partially oxidized metal silicide layer;
cleaning the one or more oxidized regions of the metal silicide with reactive species to remove the oxidized regions, providing an altered metal silicide layer; and
exposing the altered metal silicide layer to a silicon-containing compound at conditions sufficient to recover the metal silicide layer, wherein the silicon-containing compound and the reactive species are different, wherein cleaning the one or more oxidized regions comprises;
supporting the substrate having the at least partially oxidized metal silicide layer disposed thereon in a vacuum chamber;
generating the reactive species from a gas mixture within the chamber;
cooling the substrate within the chamber;
directing the reactive species to the cooled substrate to react with the native oxides thereon and form a film on the at least partially oxidized metal silicide layer; and
heating the substrate within the chamber to vaporize the film.

11. The method of claim 10, wherein cooling the substrate comprises maintaining the substrate temperature below about 50° C.

12. The method of claim 11, wherein heating the substrate comprises positioning the substrate adjacent a heated gas distribution plate disposed within the vacuum chamber and maintaining the substrate temperature above about 100° C.

13. A method for forming a metal contact, comprising:
positioning a substrate having an at least partially oxidized nickel silicide surface disposed thereon in a processing chamber;
generating reactive species within the chamber from a gas comprising $NF_3$, $NH_3$, or a mixture thereof;
cooling the substrate within the chamber to a temperature below about 40° C.;
directing the reactive species to the cooled substrate to react with the native oxides thereon;
heating the substrate within the chamber to a temperature above about 115° C. to provide an altered nickel silicide surface represented by $Ni_xSi$, where x is greater than 1;
exposing the altered nickel silicide surface to silane for about 180 seconds or less at a temperature between about 300° C. and about 400° C. at a pressure of about 0.5 Torr to about 10 Torr to recover the nickel silicide surface to NiSi.

14. The method of claim 13, wherein the reactive species comprise one or more fluorine radicals, hydrogen radicals, or both.

* * * * *

UNITED STATES PATENT AND TRADEMARK OFFICE
CERTIFICATE OF CORRECTION

PATENT NO. : 7,550,381 B2
APPLICATION NO. : 11/183999
DATED : June 23, 2009
INVENTOR(S) : Lu et al.

It is certified that error appears in the above-identified patent and that said Letters Patent is hereby corrected as shown below:

Column 3, Line 59, please delete "suicide" and insert --silicide-- therefor;

Column 3, Line 62, please delete "suicide" and insert --silicide-- therefor;

Column 4, Line 66, please delete "suicide" and insert --silicide-- therefor;

Column 5, Line 3, please delete "suicide" and insert --silicide-- therefor;

Column 12, Line 36, please delete "suicide" and insert --silicide-- therefor;

Column 14, Line 1, please delete "suicide" and insert --silicide-- therefor.

Signed and Sealed this

Eighteenth Day of August, 2009

David J. Kappos
*Director of the United States Patent and Trademark Office*